(12) United States Patent
Nakamura et al.

(10) Patent No.: US 8,015,700 B2
(45) Date of Patent: Sep. 13, 2011

(54) METHOD OF FABRICATING WIRING BOARD AND METHOD OF FABRICATING SEMICONDUCTOR DEVICE

(75) Inventors: Junichi Nakamura, Nagano (JP); Yuji Kobayashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 426 days.

(21) Appl. No.: 11/419,887

(22) Filed: May 23, 2006

(65) Prior Publication Data

US 2006/0270211 A1 Nov. 30, 2006

(30) Foreign Application Priority Data

May 31, 2005 (JP) .................................. 2005-159993
Jan. 23, 2006 (JP) .................................. 2006-014199

(51) Int. Cl.
*H05K 3/36* (2006.01)
*H05K 3/34* (2006.01)
*H05K 3/02* (2006.01)
*H05K 3/10* (2006.01)
*H01K 3/10* (2006.01)

(52) U.S. Cl. ................. 29/830; 29/840; 29/846; 29/852

(58) Field of Classification Search ................. 29/830, 29/840, 846, 852
See application file for complete search history.

(56) References Cited

U.S. PATENT DOCUMENTS

| 4,889,584 | A * | 12/1989 | Wada et al. ................. 216/17 |
| 6,350,957 | B1 * | 2/2002 | Shingai et al. ............... 174/254 |
| 6,930,255 | B2 * | 8/2005 | Wakihara et al. ............ 174/250 |
| 2001/0008780 | A1 * | 7/2001 | Tandy et al. .................. 438/127 |
| 2001/0020739 | A1 * | 9/2001 | Honda .......................... 257/684 |
| 2003/0001256 | A1 * | 1/2003 | Sato et al. .................... 257/723 |
| 2003/0155638 | A1 * | 8/2003 | Ito ................................. 257/678 |
| 2004/0026767 | A1 * | 2/2004 | Sato et al. .................... 257/678 |
| 2004/0060174 | A1 * | 4/2004 | Imafuji et al. ................. 29/831 |
| 2004/0076744 | A1 * | 4/2004 | Okajima et al. ............... 427/96 |
| 2004/0209398 | A1 * | 10/2004 | Iljima et al. .................. 438/107 |
| 2005/0088833 | A1 * | 4/2005 | Kikuchi et al. ............... 361/763 |
| 2005/0168304 | A1 * | 8/2005 | Yamaguchi et al. ......... 333/246 |
| 2005/0230835 | A1 * | 10/2005 | Sunohara et al. ............ 257/758 |
| 2005/0238878 | A1 * | 10/2005 | Usui et al. .................. 428/411.1 |

FOREIGN PATENT DOCUMENTS

| JP | 4-322252 | 11/1992 |
| JP | 11-307883 | 11/1999 |
| JP | 2000-22318 | 1/2000 |
| JP | 2001-094259 | 4/2001 |
| JP | 2002-198462 | 7/2002 |
| JP | 2003-229512 | 8/2003 |
| JP | 2006-5097 | 1/2006 |
| JP | 2001-094259 | * 4/2008 |

* cited by examiner

*Primary Examiner* — A. Dexter Tugbang
*Assistant Examiner* — David P Angwin
(74) *Attorney, Agent, or Firm* — Rankin, Hill & Clark LLP

(57) ABSTRACT

A method of fabricating a wiring board includes forming a resist layer, such as a solder or plating resist layer, defining an opening portion on a support board such that a portion of the support board is exposed. An electrode is formed directly on the support board within the opening portion, and the plating resist layer, when used, is removed. An insulating layer is formed on the electrode, as well as the support board or solder resist layer, and a wiring portion connected to the electrode at the insulating layer is also formed. A solder resist layer having an opening portion is then formed on the wiring portion, and the support board is removed to expose a surface of the electrode or a surface of the electrode and insulating layer. Another solder resist layer having an opening portion may then be formed on the exposed surface of the insulating layer.

23 Claims, 17 Drawing Sheets

METHOD OF FABRICATING WIRING BOARD AND METHOD OF FABRICATING SEMICONDUCTOR DEVICE

The present application claims foreign priority based on Japanese Patent Application No. 2005-159993, filed May 31, 2005 and Japanese Patent Application No. 2006-014199, filed Jan. 23, 2006, the contents of which are incorporated herein by reference.

BACKGROUND OF THE INVENTION

1. Technical Field

The present disclosure relates to a method of fabricating a wiring board formed on a support board and a method of fabricating a semiconductor device constituted by mounting a semiconductor chip on the wiring board.

2. Related Art

In recent years, high density formation and thin-sized formation of a semiconductor chip has been promoted in accordance with high speed formation and high integrated formation of a semiconductor device and high density formation/thin-sized formation are requested similarly to a wiring board connected with the semiconductor chip.

In order to deal with high density formation of a wiring of the wiring board and thin-sized formation thereof, in recent years, the main current is constituted by a method of forming a wiring board by a so-to-speak build up method. When a multilayer wiring board is formed by the build up method, the multilayer wiring board is formed as follows.

First, a build up layer comprising an insulating resin layer is formed on a support board (core board) having a pertinent rigidity, a via hole is formed at the build up layer, thereafter, a via plug is formed at the via hole by a plating method and a pattern wiring connected to the via plug is formed. Thereafter, by repeating the steps, a multilayer wiring board can be formed by the build up method.

The build up layer (insulating resin layer) comprises a soft material of, for example, thermosetting epoxy resin or the like and therefore, in order to maintain flatness of the build up layer, there is adopted a method of forming the build up layer on a support board having a pertinent rigidity (For example, See Japanese patent document JP-A-2002-198462).

However, it is requested to further subject the wiring board formed by the build up method to thin-sized formation and therefore, there has been proposed a structure of removing the support board, or a wiring board having a so-to-speak coreless structure.

However, when the wiring board is constituted by the coreless structure, a rigidity of the wiring board is reduced. Therefore, there poses a problem which becomes difficult when after removing the support board or exfoliating the wiring board from the support board, a step of laminating a necessary layer on the wiring board and working the wiring board is provided. An example of the step will be explained as follows.

For example, water absorbing performance of the build up layer is high and in a state of exposing a surface thereof, there is brought about a concern in insulation reliability over a long period of time and it is preferable to cover the surface by a protecting layer of a solder resist layer or the like. However, according to the build up method of the related-art, when the solder resist layer covering the surface of the build up layer formed right above the support board is formed, it is necessary to remove the support board or exfoliate the build up layer from the support board.

In this case, it is necessary to carry the wiring board in the midst of working in which the support board is removed and the rigidity is reduced to pose a problem that a concern of damaging the wiring board is increased. Further, when the solder resist layer is formed at the build up layer after removing the support board, the rigidity is insufficient and therefore, there is a case of posing a problem in flatness of the wiring board.

Therefore, there is a case in which it is difficult to excellently maintain accuracy of working the solder resist layer. The problem of the accuracy of working the solder resist layer becomes significant particularly when a wiring board in correspondence with a high function semiconductor chip in recent years which is subjected to high density/high integrated formation.

SUMMARY OF THE INVENTION

The disclosure below describes a method of forming a novel and useful wiring board resolving the above-described problem.

The disclosure describes a method of fabricating a wiring board and a method of fabricating a semiconductor device constituted by mounting the semiconductor device on the wiring board.

In a first aspect, the disclosure describes a method of fabricating a wiring board comprising a first step of forming a first solder resist layer having a first opening portion on a support board, a second step of forming an electrode at the first opening portion, a third step of forming an insulating layer on the electrode and forming a wiring portion connected to the electrode at the insulating layer, a fourth step of forming a second solder resist layer having a second opening portion on the wiring portion, and a fifth step of removing the support board.

According to the method of fabricating the wiring board, there can be provided the method of fabricating the wiring board capable of constituting thin-sized formation and capable of dealing with high density wiring.

Further, when the support board comprises a conductive material and the electrode is formed by an electrolytic plating method, the electrode can be formed by an easy method and with excellent working accuracy.

Further, when the second step includes a step of forming a recess portion by etching the support board and the electrode is formed to correspond to the recess portion, the electrode can be constituted by a structure of being projected from the first solder resist layer.

Further, when the second step includes a step of forming an electrode height adjusting layer at the first opening portion and the electrode is formed on the electrode height adjusting layer, the electrode can be constituted by a structure of being recessed from the first solder resist layer.

Further, when in the fifth step, the electrode height adjusting layer is removed along with the support board, the step of removing the electrode height adjusting layer becomes simple, which is preferable.

Further, when the support board and the height adjusting layer comprise Cu or a Cu alloy, the support and the height adjusting layer can be removed by the same etching solution.

Further, when a thickness of the electrode height adjusting layer is equal to or larger than a thickness of the first solder resist layer, the electrode can be constituted by a structure of being embedded in the insulating layer.

Further, when an area of the electrode is larger than an area of the first opening portion, a strength of the electrode is improved.

Further, when there is provided the method of fabricating a wiring board, further comprising a sixth step of pasting the support board together with a separate support board before the first step, a seventh step of forming a third solder resist layer having a third opening portion on the separate support board, an eighth step of forming a separate electrode at the third opening portion, a ninth step of forming a separate insulating layer to cover the separate electrode and forming a separate wiring portion connected to the separate electrode at the separate insulating layer, a tenth step of forming a fourth solder resist layer having a fourth opening portion to cover the separate wiring portion, and an eleventh step of removing the separate support board, the wiring boards can be formed at both of the support board and the separate support board.

Further, in a second aspect of the invention, the disclosure describes a method of fabricating a semiconductor device using the method of fabricating a wiring board, characterized in further comprising a mounting step of mounting a semiconductor chip to be electrically connected to the wiring portion from the second opening portion after the fourth step.

According to the method of fabricating a semiconductor device, there can be provided the method of fabricating a semiconductor device capable of constituting thin-sized formation and capable of dealing with high density wiring.

Further, when the method further comprises a step of etching the support board exposed from the first opening portion and forming an external connecting terminal at the etched support board after the first step, a portion of connecting the semiconductor device and an object to be connected is easily formed.

Further, in a third aspect of the invention, the disclosure describes a method of fabricating a semiconductor device characterized in a method of fabricating a semiconductor device using the method of fabricating the wiring board, further comprising a mounting step of mounting a semiconductor chip to be electrically connected to the wiring portion by way of the electrode after the fifth step.

According to the method of fabricating a semiconductor device, there can be provided the method of fabricating a semiconductor device capable of constituting thin-sized formation and capable of dealing with high density wiring.

Further, when the method further comprises a step of etching the support board exposed from the first opening portion and forming a semiconductor connecting terminal at the etched support board after the first step, wherein the semiconductor chip is mounted on the semiconductor chip connecting terminal, the semiconductor chip is easily mounted.

One or more of the following advantages may be present in some implementations. For example, there can be provided the method of fabricating a wiring board capable of constituting thin-sized formation and capable of dealing with high density wiring and the method of fabricating a semiconductor device constituted by mounting the semiconductor device on the wiring board.

Further, the wiring board which is constituted by a coreless structure, both sides of which are covered by the solder resist layers and which is formed by a build up method can be provided.

Further, the wiring board constituted by the coreless structure and subjected thin-sized formation can be formed, further, the first opening portion is formed in a state in which flatness of the first resist layer is excellent and therefore, accuracy of working the first opening portion becomes excellent. Therefore, the wiring board capable of dealing with a high density wiring, and a semiconductor device constituted by mounting the semiconductor device on the wiring board can be fabricated.

Other features and advantages may be apparent from the following detailed description, the accompanying drawings and the claims.

DETAILED DESCRIPTION OF THE INVENTION

Next, embodiments of the invention will be explained in reference to the drawings.

Exemplary, Non-Limiting Embodiment 1

FIG. 1A through FIG. 1E are views showing a method of fabricating a wiring board according to exemplary, non-limiting Embodiment 1 of the invention in accordance with a procedure thereof.

Figure 1A:
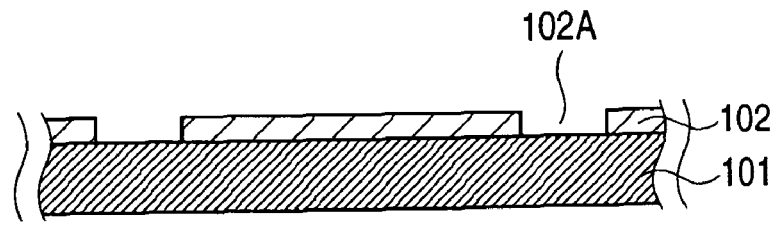
FIG. 1A is a view showing a method of fabricating a wiring board according to exemplary, non-limiting Embodiment 1 (part 1).

First, at step shown in FIG. 1A, a solder resist layer 102 comprising a photosensitive resin material is formed on a support board 101 comprising a conductive material of, for example, Cu or the like by, for example, a screen printing method. In this case, the solder resist layer 102 can also be formed by a method of laminating or coating, for example, a film-like resist material.

Next, ultraviolet ray is irradiated to the solder resist layer 102 by way of a mask pattern (not illustrated) to expose to thereby pattern the solder resist layer 102 and form an opening portion 102A. There is brought about a state of exposing the support board 101 from the opening portion 102A.

Figure 1B:
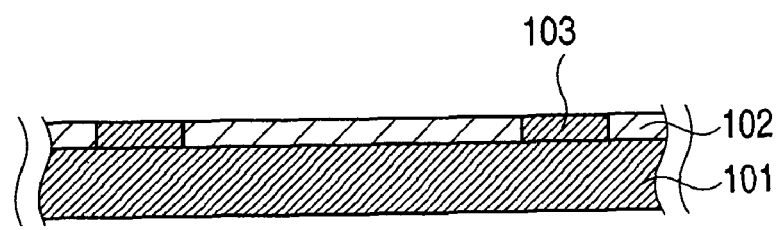
FIG. 1B is a view showing the method of fabricating the wiring board according to exemplary, non-limiting Embodiment 1 (part 2).

Next, at a step shown in FIG. 1B, by electrolytic plating constituting an electricity conducting path by the support board 101, an electrode 103 comprising, for example, Au/Ni is formed on the support board 101 to be embedded in the opening portion 102A. Further, the electrode comprising Au/Ni signifies an electrode constituted by laminating an Au layer and an Ni layer, formed such that Au is disposed on a surface side (connecting face) when the wiring board is finished (the same as follows). In this case, when the support board 101 comprises a conductive material, the electrode 103 can be formed by electrolytic plating and it is further preferable when the support board 101 comprises a conductive material having low resistance of Cu or the like.

Figure 1C:
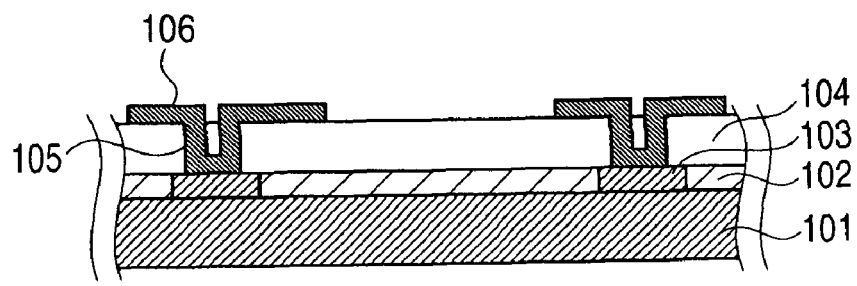
FIG. 1C is a view showing the method of fabricating the wiring board according to exemplary, non-limiting Embodiment 1 (part 3).

Next, at a step shown in FIG. 1C, an insulating layer (build up layer) 104 comprising, for example, thermosetting epoxy resin is formed on the solder resist layer 102 and on the electrode 103. Next, a via hole is formed at the insulating layer 104 by, for example, laser.

Next, a via plug 105 is formed at the via hole and a pattern wiring 106 connected to the via plug 105 is formed on the insulating layer 104 by, for example, a semiadditive method. In this case, it is preferable to form a seed layer on the insulating layer 104 by electroless plating and thereafter form the via plug 105 on the pattern wiring 106 by electrolytic plating. In this way, a wiring layer comprising the via plug 105 and the pattern wiring 106 is formed.

Figure 1D:
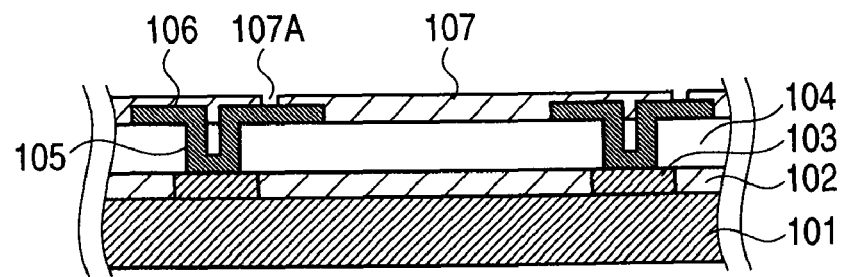
FIG. 1D is a view showing the method of fabricating the wiring board according to exemplary, non-limiting Embodiment 1 (part 4).

Next, at a stop shown in FIG. 1D, a solder resist layer 107 is formed on the insulating layer 104 to cover the pattern wiring 106 by, for example, a screen printing method. Next, ultraviolet ray is irradiated to the solder resist layer by way of a mask pattern (not illustrated) to be exposed to thereby pattern the solder resist layer 107 and form an opening portion 107A. There is brought about a state of exposing a portion of the pattern wiring 106 from the opening portion 107A.

Figure 1E:
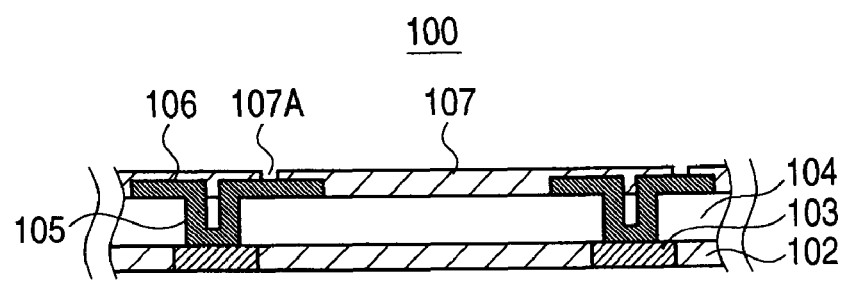
FIG. 1E is a view showing the method of fabricating the wiring board according to exemplary, non-limiting Embodiment 1 (part 5).

Next, in a step shown in FIG. 1E, the support board 101 is removed, for example, wet etching to form a wiring board 100.

According to the board 100, the electrode 103 is disposed on a side of being connected to an external connected apparatus of, for example, a mother board or the like (so-to-speak land side) and the pattern wiring 106 exposed from the opening portion 107A is connected with, for example, a semiconductor chip. In this case, the electrode 103 may be formed with, for example, a solder ball or the like. Further, the pattern wiring 106 exposed from the opening portion 107A may be formed with, for example, an electrode comprising Au/Ni, or a solder ball, or a solder layer for reflow or the like.

According to the embodiment, one of characteristics thereof resides in that prior to forming the insulating layer 104, the solder resist layer 102 is formed on the support board 101. Therefore, the wiring board by the build up method which is constituted by the coreless structure and both sides of which are covered by the solder resist layer can be formed.

In this case, there is achieved an effect of capable of protecting the both sides of the insulating layer 104 by the solder resist layers, reducing a difference between stresses applied on the both sides of the insulating layer 104 and restraining the wiring board from being warped.

Further, in the case of the embodiment, the opening portion 107A is formed in a state of supporting the solder resist layer 107 by the support board 101 and therefore, when the opening portion 107A is formed, flatness of the solder resist layer 107 is excellent. Therefore, accuracy of working the opening portion 107A becomes excellent and the opening portion 107A can be formed by a fine shape and a fine pitch.

In a semiconductor chip of the recent years, high integrated formation/high density wiring formation are progressed, also at a portion of connecting a semiconductor chip and a wiring board, fine pitch formation and high density wiring formation are progressed and therefore, particularly, accuracy of positioning the opening portion 107A and working accuracy of a shape thereof are needed. According to the method of fabricating the wiring board according to the embodiment, the wiring board in correspondence with the requests and in correspondence with fine pitch formation/high density wiring formation can be formed.

Further, according to the method of fabricating the wiring board according to the embodiment, a so-to-speak coreless structure is realized by removing the support board and thin-sized formation of the wiring board is realized in correspondence with the high density wiring.

Further, according to the wiring board according to the embodiment, the electrode 103 is disposed on a side of connecting an external apparatus of a mother board or the like (so-to-speak land side). Therefore, an area (opening diameter) of the opening portion 102A becomes larger than an area (opening diameter) of the opening portion 107A. For example, there is a large difference between the opening diameters such that the opening diameter of the opening portion 107A connected with the semiconductor chip is about 80 μm through 100 μm, the opening diameter of the opening portion 102A connected with the mother board or the like is about 0.5 mm through 1 mm.

For example, when the large opening portion is formed, in the case of using laser, a problem of taking time is posed. According to the embodiment, patterning of the opening portion 102A is carried out by sensitizing and the opening portion can be formed more swiftly than in the case of laser.

Further, by repeatedly executing the step shown in FIG. 1C before forming the solder resist layer 107, the wiring board having a multilayer wiring structure can be formed.

For example, as materials of constituting the solder resist layers 102, 107, epoxy acrylic species resin, epoxy species resin, acrylic species resin can be used. Further, the method of patterning the solder resist layers 102, 107 is not limited to the method by exposure/development described above. For example, a solder resist layer formed (patterned) with an opening portion may be formed by a screen printing method. In this case, a material other than a photosensitive material can be used for the solder resist layer.

Further, although according to the embodiment, thicknesses of the electrode 103 the solder resist layer 102 are substantially the same, the invention is not limited thereto but the electrode 103 can be modified or changed variously as shown below as necessary.

Exemplary, Non-Limiting Embodiment 2

FIG. 2A through FIG. 2F are views showing a method of fabricating a wiring board according to exemplary, non-limiting Embodiment 2 of the invention in accordance with a procedure thereof. Incidentally, portions in the drawings explained above are attached with the same reference notations and an explanation thereof will be omitted. Further, a portion which is not particularly explained can be formed by a method similar to that in the case of exemplary, non-limiting Embodiment 1.

Figure 2A:
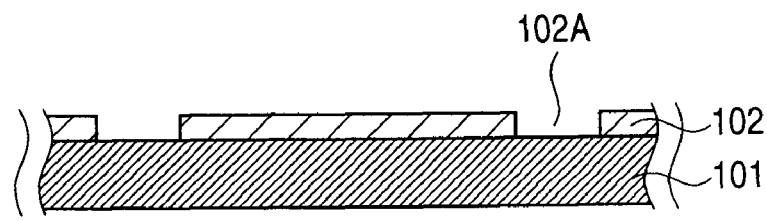
FIG. 2A is a view showing a method of fabricating a wiring board according to exemplary, non-limiting Embodiment 2 (part 1).

A step shown in FIG. 2A is similar to the step shown in FIG. 1A, the solder resist layer 102 is formed on the support board 101, and the opening portion 102A is formed at the solder resist layer 102.

Figure 2B:
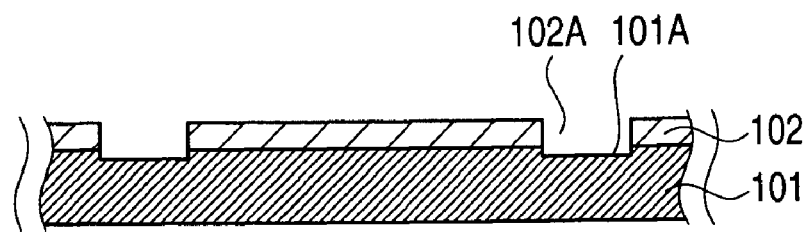
FIG. 2B is a view showing the method of fabricating the wiring board according to exemplary, non-limiting Embodiment 2 (part 2).

Next, in a step shown in FIG. 2B, a recess portion 101A is formed by etching the support board 101 exposed from the opening portion 102A.

Figure 2C:
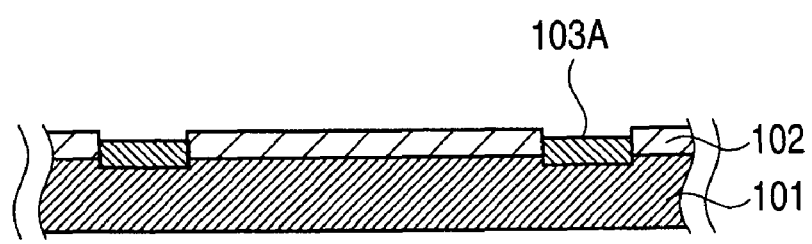
FIG. 2C is a view showing the method of fabricating the wiring board according to exemplary, non-limiting Embodiment 2 (part 3).

Next, at a step shown in FIG. 2C, an electrode 103A comprising, for example, Au/Ni is formed to be embedded in the recess portion 101A of the support board 101 and a portion of the opening portion 102A by electrolytic plating constituting an electricity conducting path by the support board 101 similar to the step shown in FIG. 1B of exemplary, non-limiting Embodiment 1. In this case, when the support board 101 comprises a conductive material, it is possible to form the electrode 103A by electrolytic plating and it is further preferable when the support board 101 comprises a conductive material having low resistance of Cu or the like.

Figure 2D:
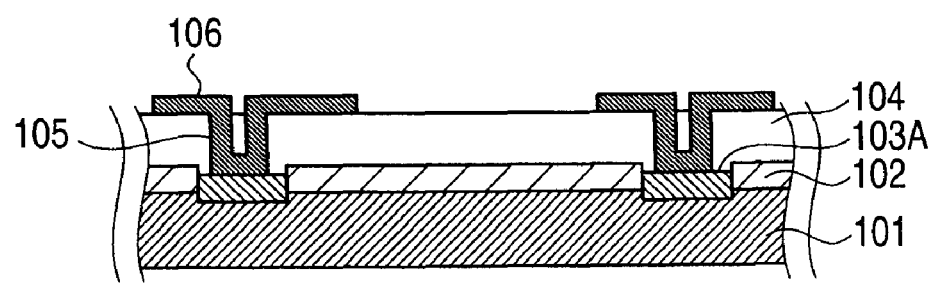
FIG. 2D is a view showing the method of fabricating the wiring board according to exemplary, non-limiting Embodiment 2 (part 4).
Figure 2E:
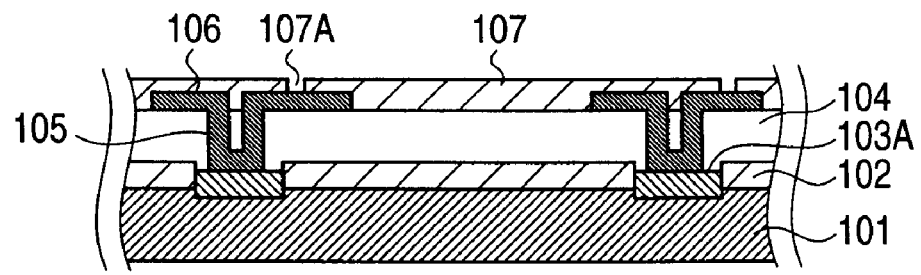
FIG. 2E is a view showing the method of fabricating the wiring board according to exemplary, non-limiting Embodiment 2 (part 5).
Figure 2F:
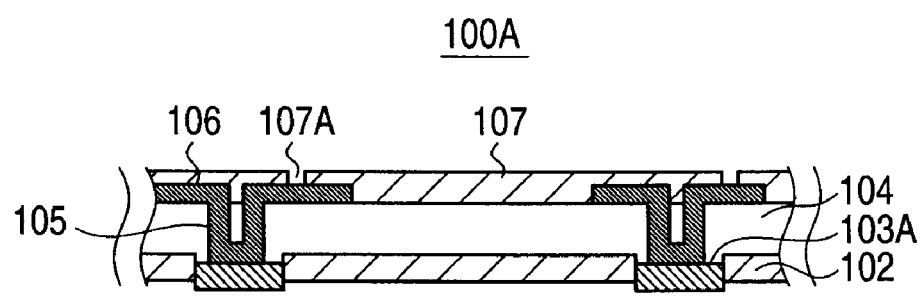
FIG. 2F is a view showing the method of fabricating the wiring board according to exemplary, non-limiting Embodiment 2 (part 6).

Next, at steps shown in FIG. 2D through FIG. 2F, the insulating layer 104, the via plug 105, the pattern wiring 106, the solder resist layer 107, and the opening portion 107A are formed similar to the steps shown in FIG. 1C through FIG. 1E of exemplary, non-limiting Embodiment 1 to form a wiring board 100A by removing the support board 101. In the case of the embodiment, the wiring board can be formed similar to exemplary, non-limiting Embodiment 1 other than forming the electrode 103A at the recess portion 101A and an effect similar to that in the case of exemplary, non-limiting Embodiment 1 is achieved.

According to the wiring board 101A according to the embodiment, the electrode 103A is constituted by a structure of being projected from the solder resist layer 102. Therefore, when a portion of connecting the electrode 103A and a mother board or the like is connected by the solder ball, a contact area of the solder ball and the electrode 103A is increased and therefore, an effect of improving electric connection reliability is achieved.

Exemplary, Non-Limiting Embodiment 3

Further, FIG. 3A through FIG. 3F are views showing a method of fabricating a wiring board according to exemplary, non-limiting Embodiment 3 of the invention in accordance with a procedure thereof. Incidentally, portions in the drawings explained above are attached with the same reference notations and an explanation thereof will be omitted. Further, portions which are not particularly explained can be formed by a method similar to that in the case of exemplary, non-limiting Embodiment 1.

Figure 3A:
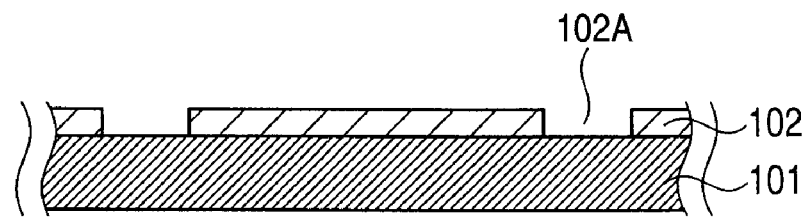
FIG. 3A is a view showing a method of fabricating a wiring board according to exemplary, non-limiting Embodiment 3 (part 1).

First, a step shown in FIG. 3A is similar to the step shown in FIG. 1A, the solder resist layer 102 is formed on the support board 101, and the opening portion 102A is formed at the solder resist layer 102.

Figure 3B:
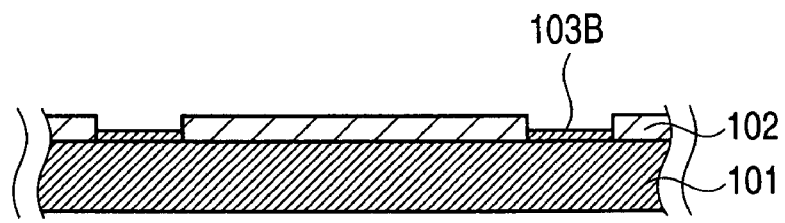
FIG. 3B is a view showing the method of fabricating the wiring board according to exemplary, non-limiting Embodiment 3 (part 2).

Next, at a step shown in FIG. 3B, an electrode height adjusting layer 103B is formed on the support board 101 exposed from the opening portion 102A by, for example, an electrolytic plating method. In this case, when the support board 101 comprises a conductive material, the electrode height adjusting layer 103B can be formed by electrolytic plating and it is further preferable when the support board 101 comprises a conductive material having low resistance of Cu or the like.

Figure 3C:
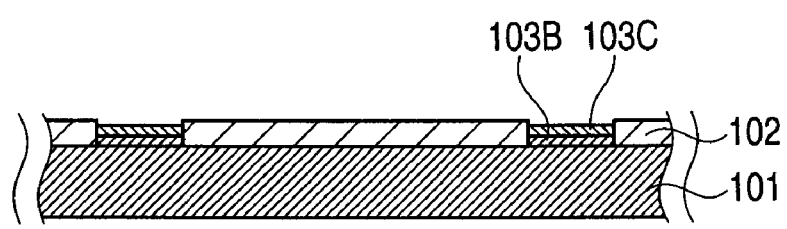
FIG. 3C is a view showing the method of fabricating the wiring board according to exemplary, non-limiting Embodiment 3 (part 3).

Next, at a step shown in FIG. 3C, an electrode 103C comprising, for example, Au/Ni is formed on the electrode height adjusting layer 103B by electrolytic plating constituting a conductive path by the support board 101 and electrode height adjusting layer 103B similar to the step shown in FIG. 1B of exemplary, non-limiting Embodiment 1.

Figure 3D:
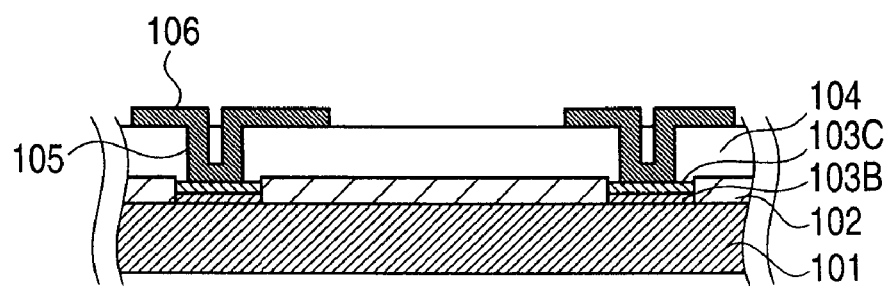
FIG. 3D is a view showing the method of fabricating the wiring board according to exemplary, non-limiting Embodiment 3 (part 4).
Figure 3E:
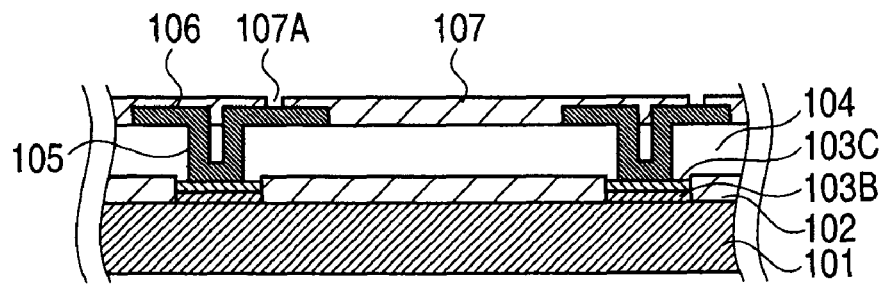
FIG. 3E is a view showing the method of fabricating the wiring board according to exemplary, non-limiting Embodiment 3 (part 5).
Figure 3F:
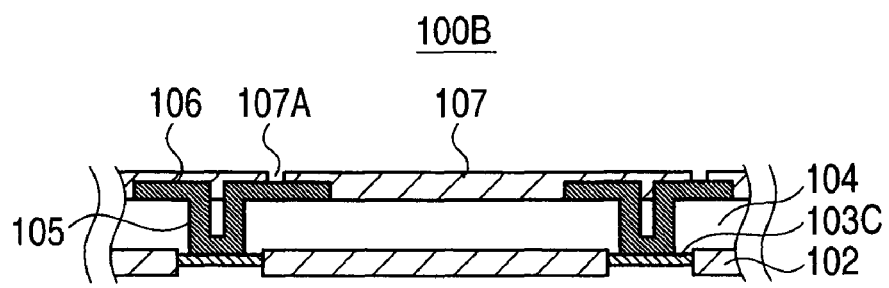
FIG. 3F is a view showing the method of fabricating the wiring board according to exemplary, non-limiting Embodiment 3 (part 6).

Next, at steps shown in FIG. 3D through FIG. 3F, the insulating layer 104, the via plug 105, the pattern wiring 106, the solder resist layer 107, and the opening portion 107A are formed similar to the steps shown in FIG. 1C through FIG. 1E of exemplary, non-limiting Embodiment 1 and a wiring board 100B is formed by removing the support board 101.

In the case of embodiment, at the step shown in FIG. 3F, when the support board 101 is removed by wet etching, the electrode height adjusting layer 103B is similarly removed. Therefore, it is preferable that the support board 101 and the electrode height adjusting layer 103B comprise the same material, for example, Cu or a Cu alloy.

In the case of the embodiment, the wiring board can be formed similar to exemplary, non-limiting Embodiment 1 other than the method of forming the electrode 103C and an effect similar that in the case of exemplary, non-limiting Embodiment 1 is achieved.

According to the wiring board 100B according to the embodiment, the electrode 103C is constituted by a structure of being recessed from a face on an outer side of the third resist layer 102.

Therefore, an effect of improving a mechanical strength of the electrode 103C is achieved. Further, when the electrode 103C and a connecting terminal or the like are connected by soldering, an effect of restraining a contiguous electrode from being shortcircuitted by making a solder flow out. Further, when a solder ball is bonded to the electrode 103C, an effect of preferably mounting the solder ball is achieved.

Further, the structure of recessing the electrode from the solder resist layer shown in the embodiment can be modified into a structure shown in exemplary, non-limiting Embodiment 4 as follows.

Exemplary, Non-Limiting Embodiment 4

FIG. 4A through FIG. 4F are views showing a method of fabricating a wiring board according to exemplary, non-limiting Embodiment 4 of the invention in accordance with a procedure thereof. Incidentally, portions in the drawings explained above are attached with the same reference notations and an explanation thereof will be omitted. Further, portions which are not explained particularly can be formed by a method similar to that in the case of exemplary, non-limiting Embodiment 3.

Figure 4A:
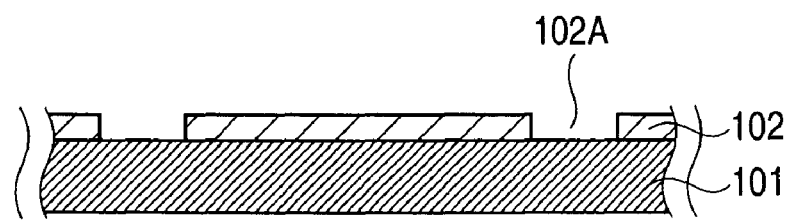
FIG. 4A is a view showing a method of fabricating a wiring board according to exemplary, non-limiting Embodiment 4 (part 1).

First, a step shown in FIG. 4A is similar to the step shown in FIG. 3A, the solder resist layer 102 is formed on the support board 101 and the opening portion 102A is formed at the solder resist layer 102.

Figure 4B:
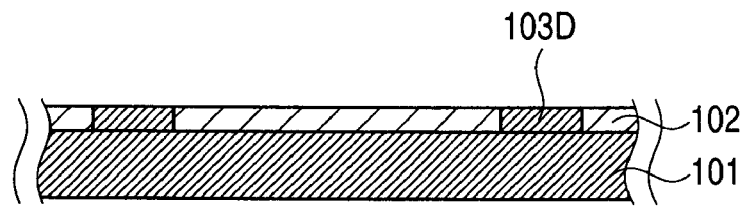
FIG. 4B is a view showing the method of fabricating the wiring board according to exemplary, non-limiting Embodiment 4 (part 2).
Figure 4C:
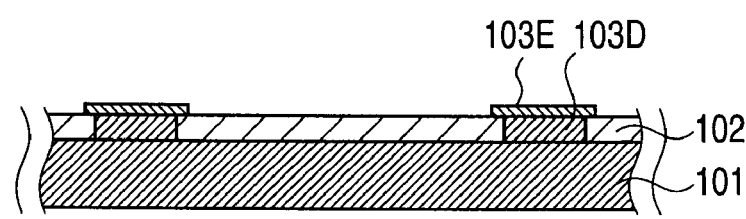
FIG. 4C is a view showing the method of fabricating the wiring board according to exemplary, non-limiting Embodiment 4 (part 3).

Next, at a step shown in FIG. 4B, an electrode adjusting layer 103D is formed on the support board 101 exposed from the opening portion 102A by, for example, an electrolytic plating method. Although in the case of exemplary, non-limiting Embodiment 3, for example, a thickness of the electrode height adjusting layer 103B becomes thinner than a thickness of the solder resist layer 102, in the case of the embodiment, a thickness of the electrode height adjusting layer 103D becomes substantially the same as the thickness of the solder resist layer 102.

Next, at steps shown in FIG. 3D, similar to the step shown in FIG. 3C, an electrode 103E comprising, for example, Au/Ni is formed on the electrode height adjusting layer 103D by electrolytic plating constituting an electricity conducting path by the support board 101 and the electrode height adjusting layer 103D similar to the step shown in FIG. 3C of exemplary, non-limiting Embodiment 3.

Figure 4D:
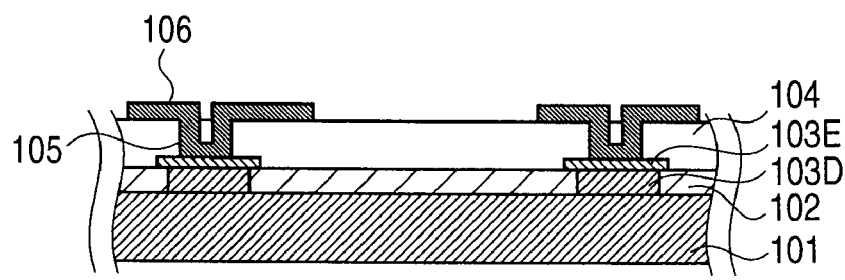
FIG. 4D is a view showing the method of fabricating the wiring board according to exemplary, non-limiting Embodiment 4 (part 4).
Figure 4E:
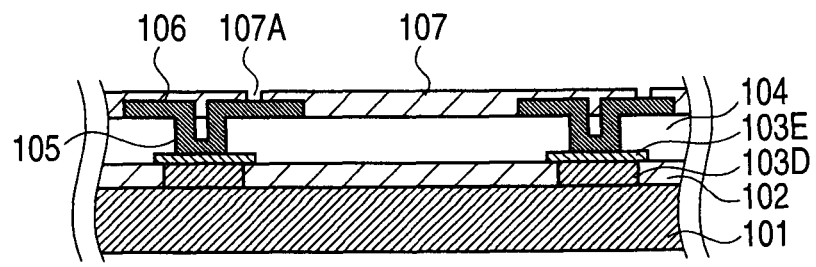
FIG. 4E is a view showing the method of fabricating the wiring board according to exemplary, non-limiting Embodiment 4 (part 5).
Figure 4F:
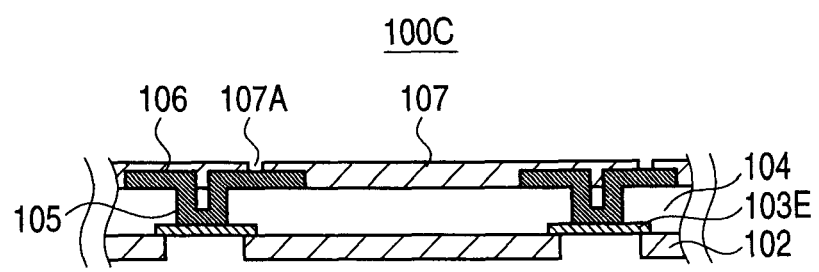
FIG. 4F is a view showing the method of fabricating the wiring board according to exemplary, non-limiting Embodiment 4 (part 6).

Next, at steps shown in FIG. 4D through FIG. 4F, the insulating layer 104, the via plug 105, the pattern wiring 106, the solder resist layer 107, and the opening portion 107A are formed similar to the steps shown in FIG. 3D through FIG. 3F of exemplary, non-limiting Embodiment 3 to form a wiring board 100C.

In the case of embodiment, when the support board 101 is removed by wet etching, the electrode height adjusting layer 103D is similarly removed similar to the step shown in FIG. 3F of exemplary, non-limiting Embodiment 3. Therefore, it is preferable that the support ball 101 and the electrode height adjusting layer 103D comprise the same material, for example, Cu.

In the case of the embodiment, the wiring board can be formed similar to exemplary, non-limiting Embodiment 3 other than the method of forming the electrode 103E and an effect similar that in the case of exemplary, non-limiting Embodiment 3 is achieved.

According to the wiring board 100C according to the embodiment, the electrode 103E is constituted by a structure of being recessed from the face on the outer side of the solder resist layer 102 and the electrode 103E is constituted by a structure of being substantially embedded in the insulating layer 104. That is, a total of a side wall face of the electrode 103E is formed to be brought into contact with the insulating layer 104. Therefore, in addition to achieving the effect in the case of exemplary, non-limiting Embodiment 3, there is achieved an effect of further improving the mechanical strength of the electrode 103C in comparison with that in the case of exemplary, non-limiting Embodiment 3.

Further, an area of the electrode 103E becomes larger than the area of the opening portion 102A. This is because when the electrode 103E is formed by electrolytic plating, the electrode 103E grows substantially isotropically and therefore, the electrode grows in a lateral direction. Therefore, there is constituted a structure of covering a peripheral edge portion of the electrode 103E by the solder resist layer 102 to achieve an effect of improving a strength of the electrode 103E.

Further, although according to the embodiment, an explanation has been given by taking an example of a case in which the thickness of the electrode height adjusting layer is substantially the same as the thickness of the solder resist layer 102, when the thickness of the electrode height adjusting layer is equal to or larger than the thickness of the solder resist layer 102, an effect similar to that in the above-described case is achieved.

Exemplary, Non-Limiting Embodiment 5

Further, for example, in the cases of exemplary, non-limiting Embodiment 1 through exemplary, non-limiting Embodiment 4, it is also possible to use a structure of pasting two sheets of the support boards 101 together to form wiring boards at the respective support boards and in that case, an efficiency of forming the wiring board can be improved.

Figure 5:
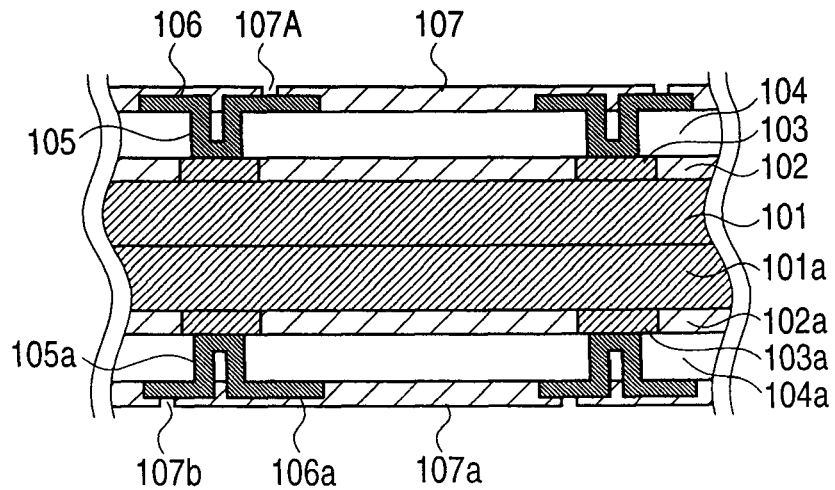
FIG. 5 is a view showing a method of fabricating a wiring board according to exemplary, non-limiting Embodiment 5.

FIG. 5 is a view showing a method of fabricating a wiring board according to exemplary, non-limiting Embodiment 5 of the invention. Incidentally, portions in the drawings explained above are attached with the same reference notations and an explanation thereof will be omitted.

FIG. 5 shows a step in correspondence with the step shown in FIG. 1D of exemplary, non-limiting Embodiment 1. In reference to FIG. 5, according to the embodiment, the support board 101 is provided with a structure of being pasted together with a support board 101a. The support board 101a is formed with a solder resist layer 102a, an electrode 103a, an insulating layer 104a, a via plug 105a, a patter wiring 106a, a solder resist layer 107a, and an opening portion 107b.

The solder resist layer 101a, the electrode 103a, the insulating layer 104a, the via plug 105a, the pattern wiring 106a, the solder resist layer 107a, an opening portion 107b respectively correspond to the solder resist layer 101, the electrode 103, the insulating layer 104, the via plug 105, the pattern wiring 106, the solder resist layer 107, and the opening portion 107A and can be formed similar to the case of exemplary, non-limiting Embodiment 1.

Further, after the step shown in the drawing, the support board 101 and the support board 101a are separated, a step in correspondence with the step shown in FIG. 1E of exemplary, non-limiting Embodiment 1 is executed, the support board 101 and the support board 101a are removed by wet etching, thereby, the two wiring boards can be formed.

It is apparent that the structure, the material or the like explained in the embodiments can pertinently be modified or changed. For example, the material constituting the electrodes 103, 103A, 103C, 103E, 103a or the like is not limited to Au/Ni, for example, Au/Ni/Cu, Au/Pd/Ni, Au/Pd/Ni/Cu, Au/Pd/Ni/Pd, Au/Pd/Ni/Pd/Cu, Sn—Pb/Ni, Sn—Pb/Ni/Cu, Sn—Ag/Ni, Su—Ag/Ni/Cu, or the like can be used. Further, the above-described materials are described successively from the metal layer constituting the surface (outer side) when the wiring board is finished.

Further, there may be constituted a structure of increasing a rigidity of the wiring board by providing, for example, a reinforcement plate at a peripheral edge portion of the wiring board.

Exemplary, Non-Limiting Embodiment 6

Next, an explanation will be given of an example of fabricating a semiconductor device by mounting a semiconductor chip to the above-described wiring board in reference to FIG. 6A through FIG. 6F in accordance with a procedure thereof. However, portions in the drawings explained above are attached with the same reference notations and an explanation thereof will be omitted. Further, although in the following example, an explanation will be given by taking an example of a case of mounting a semiconductor chip on the mounting board described in exemplary, non-limiting Embodiment 1, a semiconductor device can be fabricated by mounting a semiconductor chip also on the mounting board described in exemplary, non-limiting Embodiment 2 through exemplary, non-limiting Embodiment 5 by a similar procedure.

According to a method of fabricating a semiconductor device according to the embodiment, first the steps shown in FIG. 1A through FIG. 1E shown in exemplary, non-limiting Embodiment 1 are executed.

Figure 6A:
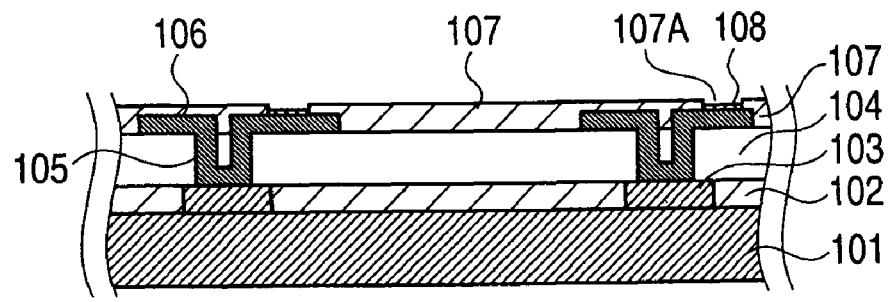
FIG. 6A is a view showing a method of fabricating a semiconductor device according to exemplary, non-limiting Embodiment 6 (part 1).

Next, at a step shown in FIG. 6A, an electrode 108 comprising Au/Ni is formed on the pattern wiring 106 exposed from the opening portion 107A of the solder resist layer 107 by, for example, a sputtering method, an electrolytic plating method, or an electroless plating method or the like.

Figure 6B:
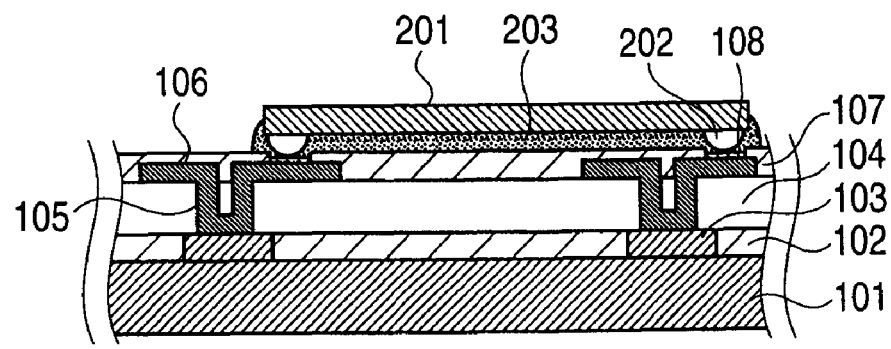
FIG. 6B is a view showing the method of fabricating the semiconductor device according to exemplary, non-limiting Embodiment 6 (part 2).

Next, at a step shown in FIG. 6B, a semiconductor chip 201 formed with a semiconductor chip connecting terminal (for example, a solder ball) 202 is mounted by flip chip mounting such that the semiconductor chip connecting terminal 202 and the electrode 108 are electrically connected.

Next, insulation and reliability of a mounted portion are ensured by permeating and curing an underfill 203 between the semiconductor chip 201 and the solder resist layer 107.

Figure 6C:
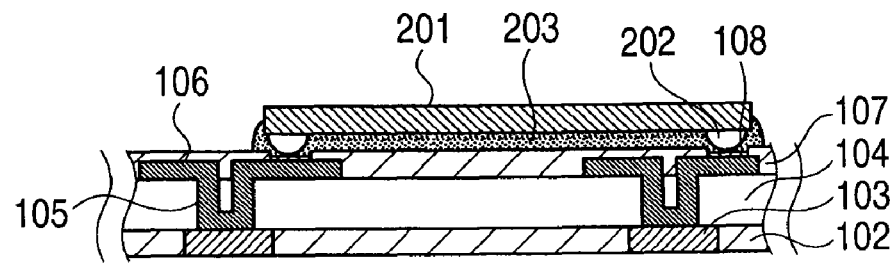
FIG. 6C is a view showing the method of fabricating the semiconductor device according to exemplary, non-limiting Embodiment 6 (part 3).

Next, at a step shown in FIG. 6C, the support board 101 is removed by, for example, wet etching similar to the step shown in FIG. 1E.

Figure 6D:
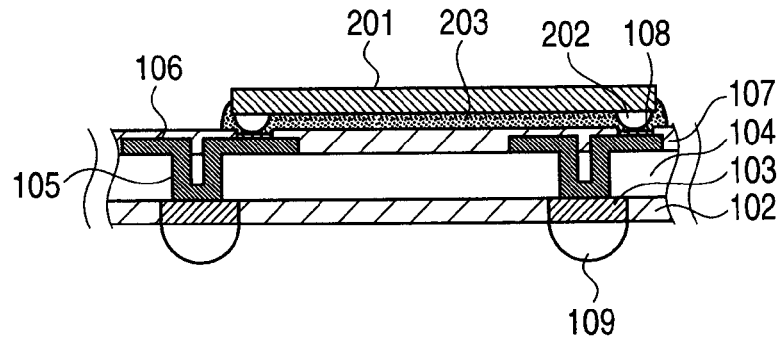
FIG. 6D is a view showing the method of fabricating the semiconductor device according to exemplary, non-limiting Embodiment 6 (part 4).

Next, at a step shown in FIG. 6D, an external connecting terminal (for example, solder ball) 109 is formed at the electrode 103 exposed by removing the support board 101. Further, in the case of the embodiment, an explanation is given by taking an example of a case of fabricating a semiconductor device having a BGA (Ball Grid Array) structure and therefore, a solder ball is formed at the electrode 103, however, the invention is not limited thereto.

For example, according to a semiconductor device having a PGA (Pin Grid Array) structure is formed with a pin as an external connecting terminal. Further, there may be constituted an LGA (Land Grid Array) structure using an electrode per se of a wiring board (semiconductor device) as an external connecting terminal by omitting to form the external connecting terminal.

Figure 6E:
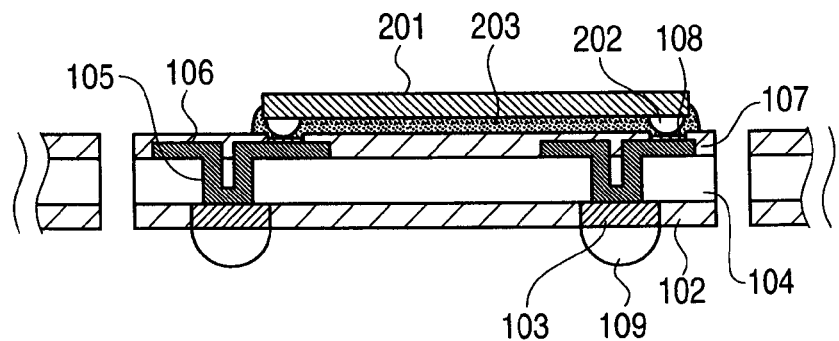
FIG. 6E is a view showing the method of fabricating the semiconductor device according to exemplary, non-limiting Embodiment 6 (part 5).
Figure 6F:
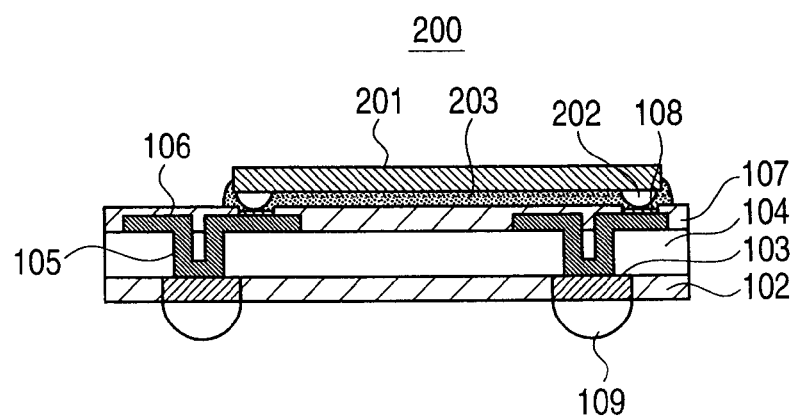
FIG. 6F is a view showing the method of fabricating the semiconductor device according to exemplary, non-limiting Embodiment 6 (part 6).

Next, at a step shown in FIG. 6E, by cutting the board 104, the solder resist layers 102, 107 to pieces, a semiconductor device 200 shown in FIG. 6F can be formed. In this case, a plurality of semiconductor devices can be formed by forming a structure of mounting a plurality of the semiconductor chips 201 on the board 104 and cutting the board 104 (solder resist layers 102, 107) to cut to pieces thereafter. Further, according to the embodiment, only a single piece of the semiconductor device is illustrated in the embodiment.

According to the method of fabricating the semiconductor device according to the embodiment, there can be fabricated the semiconductor device achieving an effect similar to the effect described in exemplary, non-limiting Embodiment 1, capable of constituting thin-sized formation and capable of dealing with high density wiring.

Exemplary, Non-Limiting Embodiment 7

Figure 7:
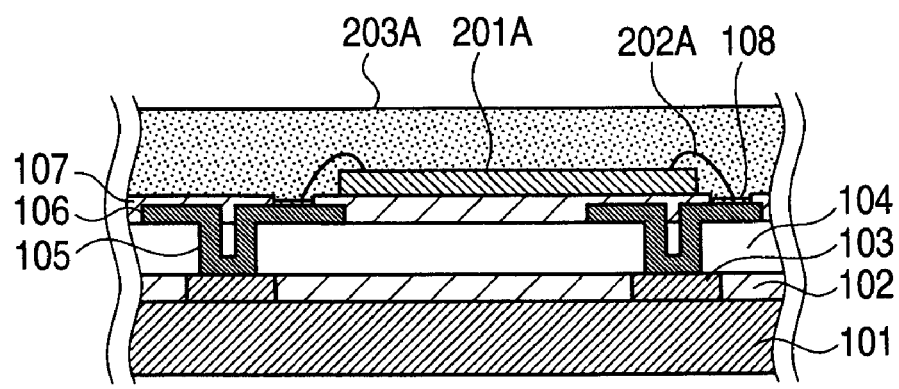
FIG. 7 is a view showing a method of fabricating a wiring board according to exemplary, non-limiting Embodiment 7.

Further, the method of mounting the semiconductor chip is not limited to the case described in exemplary, non-limiting Embodiment 6. FIG. 7 is a view showing a method of fabricating a semiconductor device according to exemplary, non-limiting Embodiment 7. However, portions in the drawings explained above are attached with the same reference notations and an explanation thereof will be omitted.

According to the method of fabricating the semiconductor device according to the embodiment, first, the steps up to FIG. 6A of exemplary, non-limiting Embodiment 6 are executed.

Next, at a step shown in FIG. 7 (in correspondence with the step of FIG. 6B of exemplary, non-limiting Embodiment 6), a semiconductor chip 201A is mounted on the solder resist layer, and the semiconductor chip 201A and the electrode 108 are connected by a wire 202A. In this case, a film made of a resin may be inserted and adhered between the semiconductor chip 201A and the solder resist layer 107. Further, the semiconductor chip 201A is sealed by a resin layer 203A.

After the step of FIG. 7, when steps in correspondence with FIG. 6C through FIG. 6F shown in exemplary, non-limiting Embodiment 6 are carried out, the semiconductor apparatus can be fabricated similar to the case of exemplary, non-limiting Embodiment 6. In this way, the semiconductor chip can be mounted also by wire bonding (the same in the following examples).

Exemplary, Non-Limiting Embodiment 8

Further, in exemplary, non-limiting Embodiment 6 or exemplary, non-limiting Embodiment 7, a method of forming the external connecting terminal (solder ball) 109 may be changed.

Figure 8A:
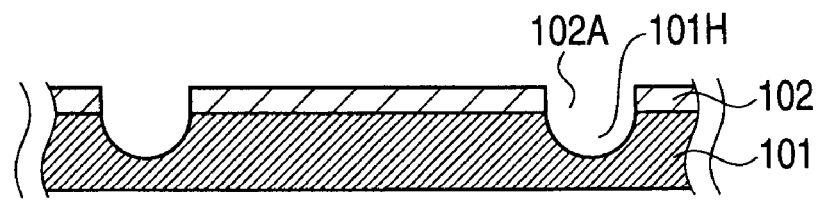
FIG. 8A is a view showing a method of fabricating a semiconductor device according to exemplary, non-limiting Embodiment 8 (part 1).
Figure 8B:
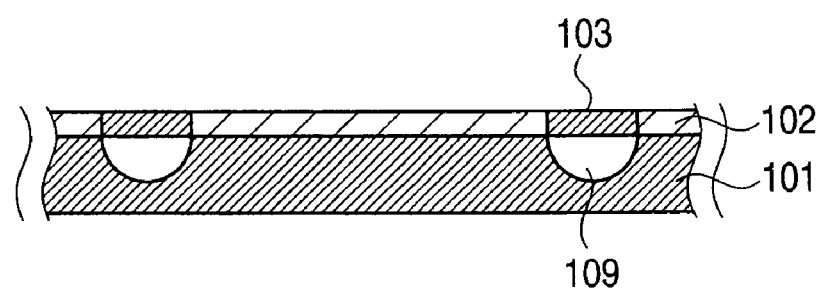
FIG. 8B is a view showing the method of fabricating the semiconductor device according to exemplary, non-limiting Embodiment 8 (part 2).

FIG. 8A through FIG. 8B are views showing a method of fabricating a semiconductor device according to exemplary, non-limiting Embodiment 8. However, in the drawings, portions explained above are attached wit the same reference notations and an explanation thereof will be omitted.

According to the method of fabricating a semiconductor chip according to the embodiment, first, the step shown in FIG. 1A of exemplary, non-limiting Embodiment 1 is carried out.

Next, in a step shown in FIG. 8A, the support board 101 exposed from the opening portion 102A is etched by constituting a mask by the solder resist layer 102 to form a recess portion 101H.

Next, at a step shown in FIG. 8B, the external connecting terminal 109 is formed to embed the recess portion 101H by electrolytic plating of a solder or the like by constituting an electricity conducting path by the support board 101. Further, the electrode 103 comprising, for example, Au/Ni is formed on the external connecting terminal 109 by electrolytic plating similar to the step shown in FIG. 1B.

In the following steps, steps similar to those of exemplary, non-limiting Embodiment 7 or exemplary, non-limiting Embodiment 8 may be carried out. That is, the steps shown in FIG. 1C through FIG. 1D and steps shown in FIG. 6A through FIG. 6B may be carried out. Further, the step of FIG. 7 may substitute for the step of FIG. 6B. In this case, the step of forming the external connecting terminal shown in FIG. 6D is dispensed with. In this way, the method/step of forming the external connecting terminal may be changed.

Exemplary, Non-Limiting Embodiment 9

Further, although according to exemplary, non-limiting Embodiment 6 through exemplary, non-limiting Embodiment 8, the semiconductor chip is mounted to a side of the solder resist layer 107, a method of fabricating the semiconductor device according to the invention is not limited thereto. For example, as explained below, the semiconductor chip may be mounted to be connected to the electrode exposed by removing the support board.

FIG. 9A through FIG. 9F are views showing a method of fabricating a semiconductor device according to exemplary, non-limiting Embodiment 9. However, portions explained above are attached with the same reference notations and an explanation thereof will be omitted.

According to the method of fabricating the semiconductor chip according to the embodiment, first, steps in correspondence with the step shown in FIG. 1A through FIG. 1D are carried out.

Figure 9A:
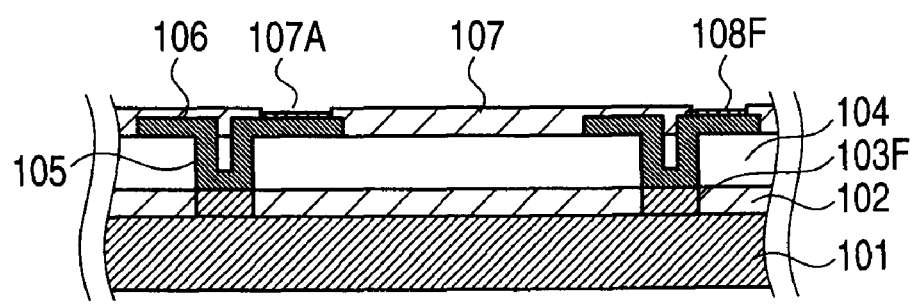
FIG. 9A is a view showing a method of fabricating a semiconductor device according to exemplary, non-limiting Embodiment 9 (part 1).

Next, at a step shown in FIG. 9A, an electrode 108F comprising Au/Ni is formed on the pattern wiring 106 exposed from the opening portion 107A of the solder resist layer 107 by, for example, a sputtering method, an electrolytic plating method or an electroless plating method or the like.

Further, in the case of the embodiment, the semiconductor chip is mounted on an electrode 103F (in correspondence with the electrode 103 in cases of exemplary, non-limiting Embodiments 6 through 8) and therefore, an area of the electrode 103F becomes smaller than that of the electrode 103 of exemplary, non-limiting Embodiments 6 through 8. Further, an external connecting terminal (for example, a solder ball or the like) is formed on the electrode 108F (in correspondence with the electrode 108 in cases of exemplary, non-limiting Embodiments 6 through 8) in later steps and therefore, an area of the electrode 108F becomes larger than that of the electrode 108 of exemplary, non-limiting Embodiments 6 through 8. Steps up to the step are made to be similar to those in cases of exemplary, non-limiting Embodiments 6 through 8 other than shapes of electrodes (opening portions of solder resist in correspondence with the electrodes).

Figure 9B:
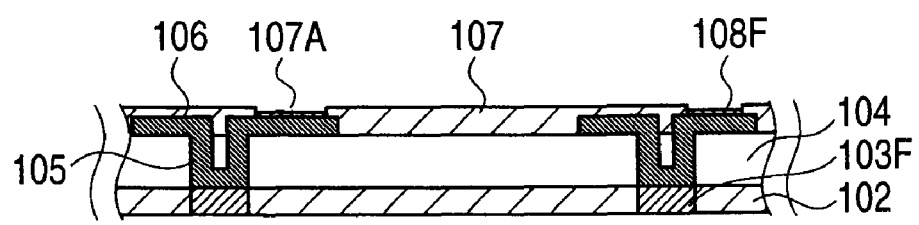
FIG. 9B is a view showing the method of fabricating the semiconductor device according to exemplary, non-limiting Embodiment 9 (part 2).

Next, at a step shown in FIG. 9B, similar to the step shown in FIG. 1E, the support board 101 is removed by etching. Here, the electrode 103F is exposed.

Figure 9C:
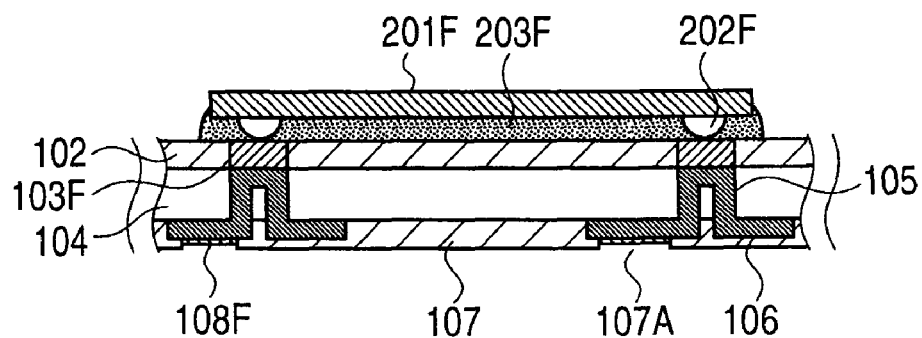
FIG. 9C is a view showing the method of fabricating the semiconductor device according to exemplary, non-limiting Embodiment 9 (part 3).

Next, at a step shown in FIG. 9c, a semiconductor chip 201F formed with a semiconductor chip connecting terminal (for example, solder ball) 202F is mounted by flip chip mounting such that the semiconductor chip connecting terminal 202F and the electrode 103F are electrically connected. The semiconductor chip 201F is electrically connected to the pattern wiring 106 by way of the electrode 103F. That is, in the case of the embodiment, the semiconductor chip is mounted to a side of the electrode 103F exposed by removing the support board 101.

Next, insulation and reliability of a mounted portion are ensured by permeating and curing an underfill 203F between the semiconductor chip 201F and the solder resist layer 102.

Figure 9D:
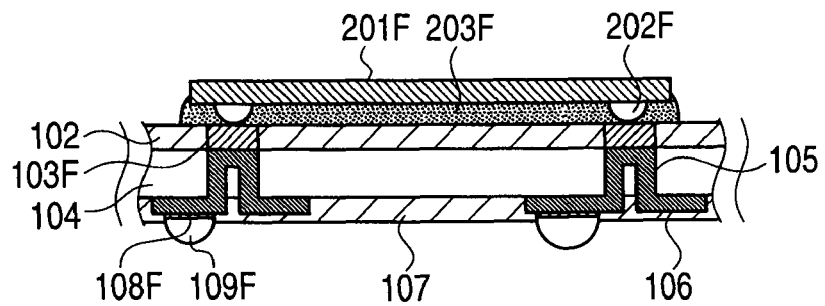
FIG. 9D is a view showing the method of fabricating the semiconductor device according to exemplary, non-limiting Embodiment 9 (part 4).

Next, at a step shown in FIG. 9D, an external connecting terminal (solder ball) 109F is formed at the electrode 108F. Further, the external connecting terminal 109F may be omitted to be formed or a pin may be formed at the electrode 108F as the external connecting terminal similar to the case of exemplary, non-limiting Embodiment 6.

Figure 9E:
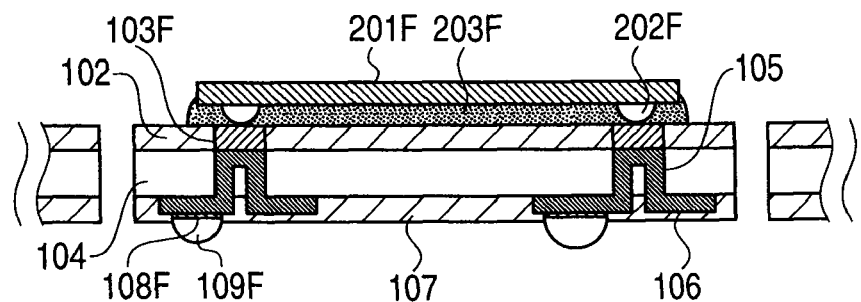
FIG. 9E is a view showing the method of fabricating the semiconductor device according to exemplary, non-limiting Embodiment 9 (part 5).
Figure 9F:
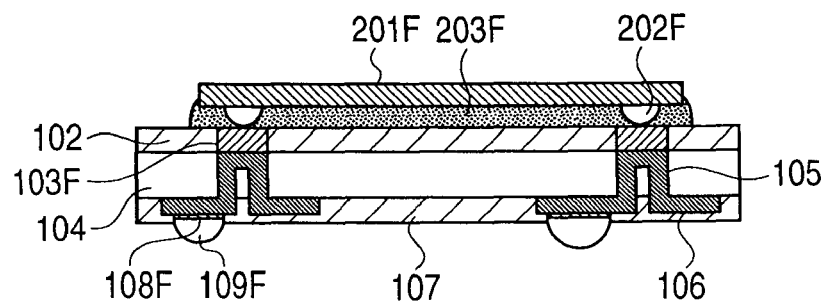
FIG. 9F is a view showing the method of fabricating the semiconductor device according to exemplary, non-limiting Embodiment 9 (part 6).

Next, a semiconductor device 200A shown in FIG. 9F can be formed by cutting the board 104, the solder resist layers 102, 107 to pieces at a step shown in FIG. 9E.

According to the method of fabricating the semiconductor device according to the embodiment, there can be fabricated the semiconductor device achieving an effect similar to the effect described in exemplary, non-limiting Embodiment 6, capable of constituting thin-sized formation and capable of dealing with high density wiring. Further, the semiconductor chip may be mounted by wire bonding and resin sealing as shown by exemplary, non-limiting Embodiment 7.

Exemplary, Non-Limiting Embodiment 10

Further, in exemplary, non-limiting Embodiment 9, a semiconductor chip connecting terminal (for example, solder ball) for mounting the semiconductor chip may be provided on a side of the board as explained below.

FIG. 10A through FIG. 10F are views showing a method of fabricating a semiconductor device according to exemplary, non-limiting Embodiment 10. However, portions in the drawings explained above are attached with the same reference notations and an explanation thereof will be omitted.

According to the method of fabricating the semiconductor device according to the embodiment, first, a step in correspondence with the step shown in FIG. 1A of exemplary, non-limiting Embodiment 1 is carried out. However, as explained in exemplary, non-limiting Embodiment 9, the opening portion 102A of the solder resist layer 102 is made to be smaller than that in the case of exemplary, non-limiting Embodiment 1 in correspondence with mounting the semiconductor chip.

Figure 10A:
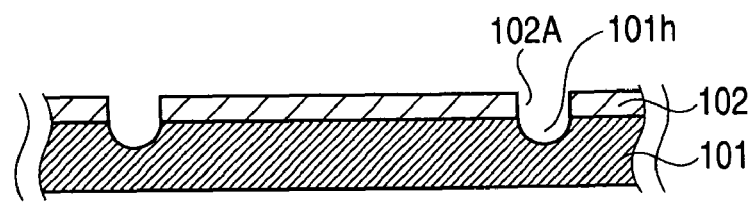
FIG. 10A is a view showing a method of fabricating a semiconductor device according to exemplary, non-limiting Embodiment 10 (part 1).

Next, at a step shown in FIG. 10A, a recess portion 101h is formed by etching the support board 101 exposed from the opening portion 102A by constituting a mask by, for example, the solder resist layer 102.

Figure 10B:
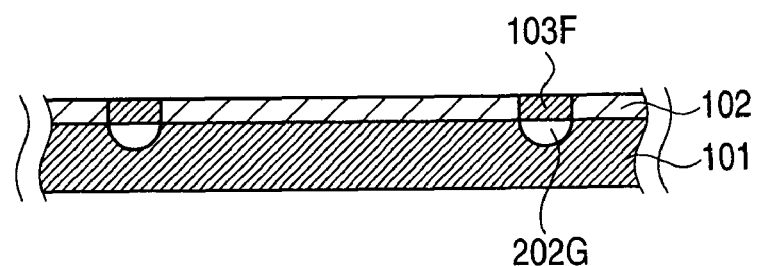
FIG. 10B is a view showing the method of fabricating the semiconductor device according to exemplary, non-limiting Embodiment 10 (part 2).

Next, at a step shown in FIG. 10B, a semiconductor chip connecting terminal (for example, solder ball) 202G is formed to embed the recess portion 101h by electrolytic plating of a solder or the like constituting an electricity conducting path by the support board 101. Further, the electrode 103F comprising, for example, Au/Ni is formed on the semiconductor chip connecting terminal 202G by electrolytic plating.

Figure 10C:
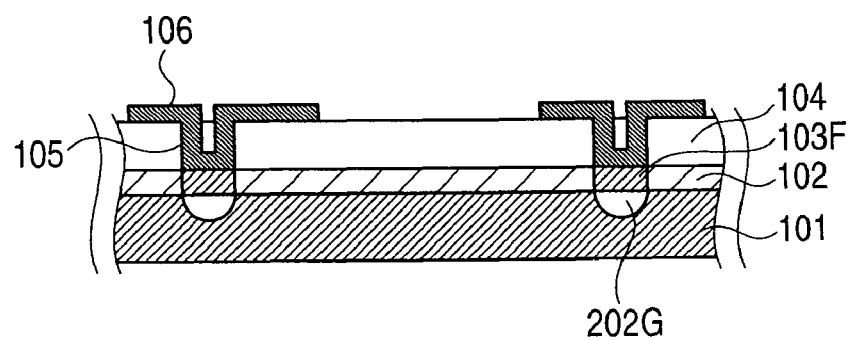
FIG. 10C is a view showing the method of fabricating the semiconductor device according to exemplary, non-limiting Embodiment 10 (part 3).

Next, at a step shown in FIG. 10C, the insulating layer 104, the via plug 105 and the pattern wiring 106 are formed similar to the step shown in FIG. 1C of exemplary, non-limiting Embodiment 1.

Figure 10D:
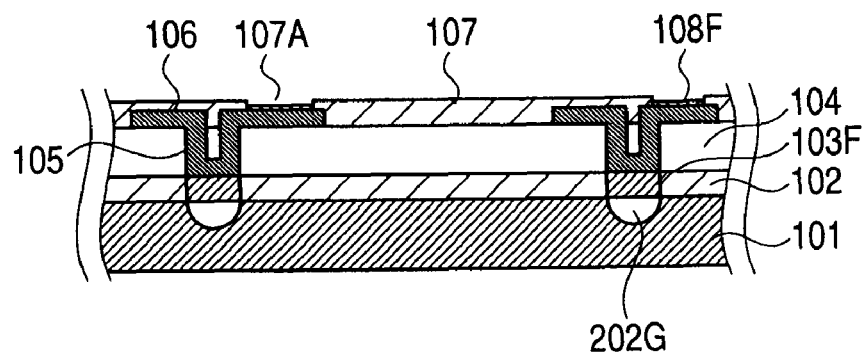
FIG. 10D is a view showing the method of fabricating the semiconductor device according to exemplary, non-limiting Embodiment 10 (part 4).

Next, at a step shown in FIG. 10D, the solder resist layer 107 having the opening portion 107A exposing a portion of the pattern wiring 106 is formed similar to the step of FIG. 1D of exemplary, non-limiting Embodiment 1.

Next, similar to the step of FIG. 9A of embodiment 9, the electrode 108F comprising Au/Ni is formed on the pattern wiring 106 exposed from the opening portion 107A of the solder resist layer 107.

Figure 10E:
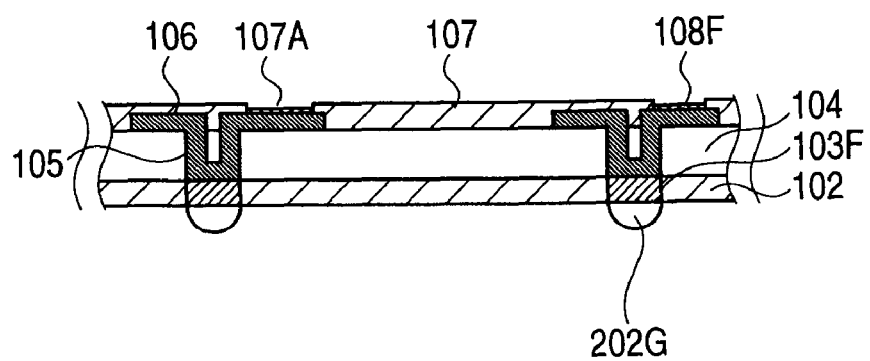
FIG. 10E is a view showing the method of fabricating the semiconductor device according to exemplary, non-limiting Embodiment 10 (part 5).

Next, at a step shown in FIG. 10E, the support board 101 is removed by, for example, wet etching. Here, the solder ball 202G is exposed.

Figure 10F:
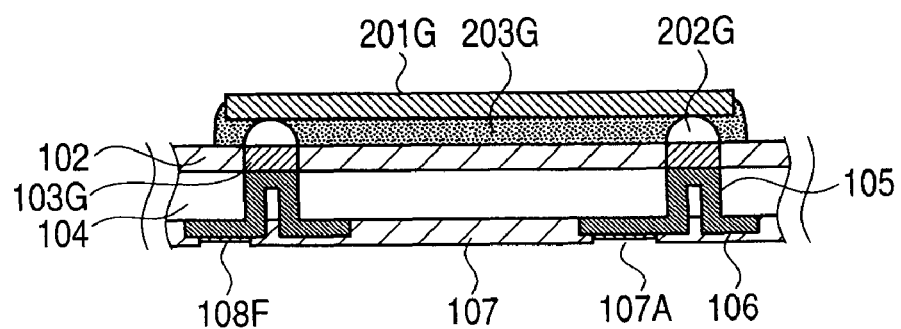
FIG. 10F is a view showing the method of fabricating the semiconductor device according to exemplary, non-limiting Embodiment 10 (part 6).

Next, at a step shown in FIG. 10F, the semiconductor chip 201G is mounted on the exposed semiconductor chip connecting terminal 202G. In this case, the semiconductor chip connecting terminal is formed on the side of the board and therefore, it is not necessary to form the semiconductor chip connecting terminal on the side of the semiconductor chip.

Further, insulation and reliability of the mounted portion are ensured by permeating and curing the underfill 203G between the semiconductor chip 201G and the solder resist layer 102.

At a step of FIG. 10F and thereafter, the semiconductor device can be formed by carrying out a step in correspondence with the step of FIG. 9E of exemplary, non-limiting Embodiment 9.

In this way, the semiconductor chip connecting terminal (for example, solder ball) for connecting the semiconductor chip and the board can also be formed on the side of the board.

Further, although in the method of fabricating the semiconductor device shown in exemplary, non-limiting Embodiment 6 through exemplary, non-limiting Embodiment 10, an explanation has been given by taking an example of a case in which the wiring portion is constituted by a single layer, the invention is not limited thereto. For example, it is apparent that the invention is applicable to a case of fabricating a semiconductor device (wiring board) having a multilayer wiring structure formed by laminating wiring portions comprising the via plugs 105 and the pattern wirings 106 in multilayers.

In a semiconductor chip of the recent years, at a portion of connecting a semiconductor chip and a wiring board, fine pitch formation and high density wiring formation are progressed. Therefore, according to the method of fabricating the wiring board according to the embodiment, the semiconductor connecting terminal in correspondence with fine pitch formation can be formed.

Exemplary, Non-Limiting Embodiment 11

Although according to exemplary, non-limiting Embodiment 1 through exemplary, non-limiting Embodiment 10, the solder resist layer 102 is formed on the support board 101 before removing the support board, a method of forming the solder resist layer according to the invention is not limited thereto. For example, as explained below, the solder resist layer may be formed on the insulating layer after removing the support board.

FIG. 11A through FIG. 11F are views showing a method of fabricating a wiring board according to exemplary, non-limiting Embodiment 11 of the invention in accordance with a procedure thereof. Incidentally, portions in the drawings explained above are attached with the same reference notations and an explanation thereof will be omitted. Further, a portion which is not particularly explained can be formed by a method similar to that in the case of exemplary, non-limiting Embodiment 11.

Figure 11A:
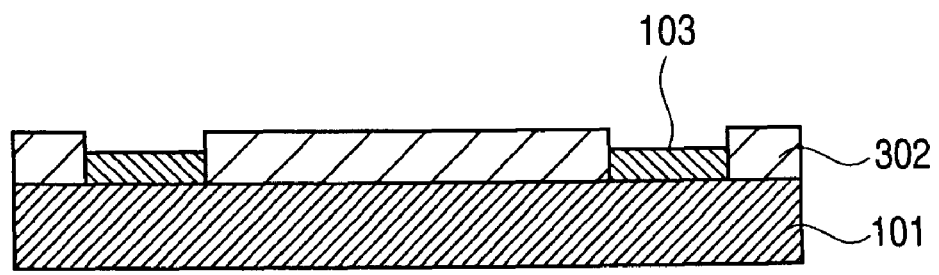
FIG. 11A is a view showing a method of fabricating a wiring board according to exemplary, non-limiting Embodiment 11 (part 1).

A step shown in FIG. 11A is similar to the steps shown in FIG. 1A and FIG. 1B, a planting resist layer 302 is formed on the support board 101, and an opening portion is formed at the plating resist layer 302. Then, by electrolytic plating constituting an electricity conducting path by the support board 101, an electrode 103 comprising, for example, Au/Ni is formed on the support board 101 to be embedded in the opening portion of the plating resist layer 302. In this case, when the support board 101 comprises a conductive material, it is possible to form the electrode 103 by electrolytic plating and it is further preferable when the support board 101 comprises a conductive material having low resistance of Cu or the like.

Figure 11B:
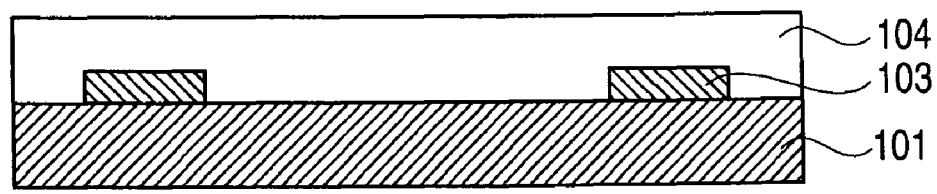
FIG. 11B is a view showing the method of fabricating the wiring board according to exemplary, non-limiting Embodiment 11 (part 2).

Next, in a step shown in FIG. 11B, the plating resist layer 302 is removed, and then an insulating layer (build up layer) 104 comprising, for example, thermosetting epoxy resin is formed on the support board 101 and on the electrode 103.

Figure 11C:
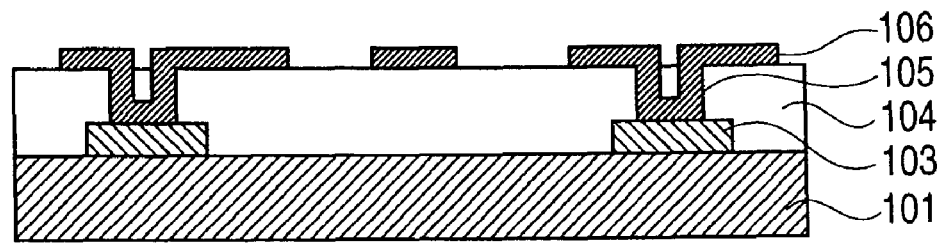
FIG. 11C is a view showing the method of fabricating the wiring board according to exemplary, non-limiting Embodiment 11 (part 3).
Figure 11D:
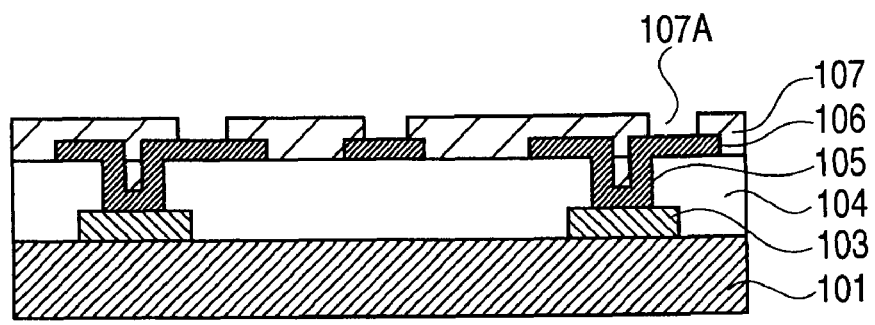
FIG. 11D is a view showing the method of fabricating the wiring board according to exemplary, non-limiting Embodiment 11 (part 4).
Figure 11E:
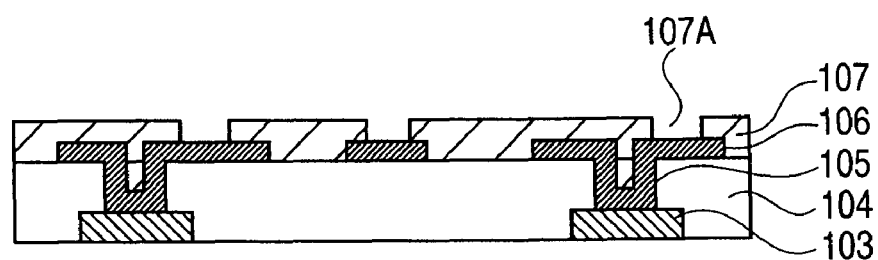
FIG. 11E is a view showing the method of fabricating the wiring board according to exemplary, non-limiting Embodiment 11 (part 5).

At steps shown in FIG. 11C through FIG. 11E, the via plug 105, the pattern wiring 106, the solder resist layer 107, and the opening portion 107A are formed similar to the steps shown in FIG. 1C through FIG. 1E of exemplary, non-limiting Embodiment 1 to form a wiring board by removing the support board 101. By repeatedly executing the step shown in FIG. 11C before forming the solder resist layer 107, the wiring board having a multilayer wiring structure can be formed.

Figure 11F:
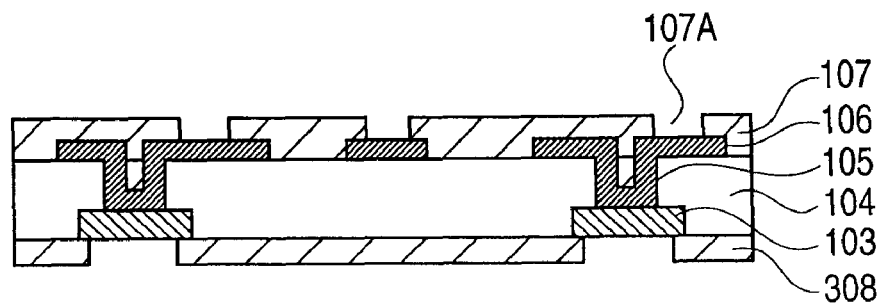
FIG. 11F is a view showing the method of fabricating the wiring board according to exemplary, non-limiting Embodiment 11 (part 6).

Next, in a step shown in FIG. 11F, a second solder resist 308 and an opening portion are formed on the insulating layer 104 by, for example, exposure/development or a screen printing method similar to the solder resist layer 102, 107 of the above-mentioned embodiments.

In the case of the embodiment, the wiring board can be formed similar to exemplary, non-limiting Embodiment 1 other than removing the plating resist layer 302 before applying the insulating layer 104 and forming the second solder resist layer 308 on the insulating layer 104 after removing the support layer 101 and an effect similar to that in the case of exemplary, non-limiting Embodiment 1 is achieved.

Further, a semiconductor device can be fabricated by the method of mounting a semiconductor chip to the wiring board as shown in Embodiments 6 to 10.

Although an explanation has been given of the invention with regard to preferable embodiments, the invention is not limited to the specific embodiments but can variously be modified or changed within the gist described in the scope of claims.

According to the foregoing arrangement, various advantages shown below may be achieved in some implementations. For example, there can be provided the method of fabricating the wiring board capable of constituting thin-sized formation and capable of dealing with high density wiring and the method of fabricating the semiconductor device constituted by mounting the semiconductor device on the wiring board.

We claim:

1. A method of fabricating a wiring board comprising:
   a first step of forming a first solder resist layer on a support board;
   a second step of forming a first opening portion through said first solder resist layer by removing a portion of the first solder resist layer so as to expose a portion of the support board that had the first solder resist layer formed thereon;
   a third step of forming a first electrode within the first opening portion by forming the first electrode directly on the portion of the support board exposed from the first opening portion by electrolytic plating;
   a fourth step of forming an insulating layer on the first electrode and the first solder resist layer, and forming a wiring portion electrically connected to the first electrode at the insulating layer;
   a fifth step of forming a second solder resist layer having a second opening portion on the wiring portion; and
   a sixth step of removing the support board so as to expose a surface of the first electrode through a surface of the first solder resist layer from which the support board is removed.

2. The method of fabricating a wiring board according to claim 1, wherein the support board comprises a conductive material and the first electrode is formed by an electrolytic plating method.

3. The method of fabricating a wiring board according to claim 1, wherein the second step includes a step of forming a recess portion by etching the support board and the third step includes forming the first electrode to correspond to the recess portion.

4. The method of fabricating a wiring board according to claim 1, wherein the third step includes a step of forming an electrode height adjusting layer at the first opening portion and the first electrode is formed on the electrode height adjusting layer.

5. The method of fabricating a wiring board according to claim 4, wherein in the sixth step, the electrode height adjusting layer is removed along with the support board.

6. The method of fabricating a wiring board according to claim 4, wherein the support board and the electrode height adjusting layer comprise Cu or a Cu alloy.

7. The method of fabricating a wiring board according to claim 4, wherein a thickness of the electrode height adjusting layer is equal to or larger than a thickness of the first solder resist layer.

8. The method of fabricating a wiring board according to claim 7, wherein an area of the first electrode is larger than an area of the first opening portion.

9. The method of fabricating a wiring board according to claim 1, further comprising:
   a seventh step of stacking and pasting the support board together with a separate support board before the first step and performing the first step, the second step, the third step, the fourth step, and the fifth step on a face opposed to a stacked face of each of the support boards;
   an eighth step of separating the separate support board from the support board; and
   performing the sixth step to each of the support board and the separate support board.

10. The method of fabricating a wiring board according to claim 1, further including a step of forming a second electrode on the wiring portion in the second opening portion.

11. The method of fabricating a wiring board according to claim 1, further comprising:
   a step of etching the support board exposed from the first opening portion and forming an external connecting terminal at the etched support board after the second step.

12. A method of fabricating a semiconductor device using the method of fabricating the wiring board according to claim 1, further comprising:
   a mounting step of mounting a semiconductor chip to be electrically connected to the wiring portion by way of the first electrode after the sixth step.

13. The method of fabricating a wiring board according to claim 1, further comprising:
   a step of etching the support board exposed from the first opening portion and forming a semiconductor chip connecting terminal at the etched support board after the second step.

14. A method of fabricating a wiring board comprising:
   a first step of forming a plating resist layer on a support board, the plating resist layer defining an opening portion through which the support board is exposed;
   a second step of forming an electrode within the opening portion of the plating resist layer by forming the electrode directly in a portion of the support board which is exposed from the opening portion by electrolytic plating and removing the plating resist layer once the electrode is formed;
   a third step of forming an insulating layer on the electrode and the support board such that a second surface of the insulating layer is provided on the support board, and forming a wiring portion connected to the electrode at the insulating layer;
   a fourth step of forming a first solder resist layer having a first opening portion on the wiring portion;

a fifth step of removing the support board so as to expose the second surface of the insulating layer and a surface of the electrode through the second surface of the insulating layer; and a sixth step of forming a second solder resist layer on the second surface of the insulating layer, the second solder resist layer having a second opening portion on the insulating layer which exposes a part of the electrode.

15. A method of fabricating a semiconductor device using the method of fabricating a wiring board according to claim 10, further comprising:

a mounting step of mounting a semiconductor chip to be electrically connected to the wiring portion by way of the second electrode after the fifth step.

16. The method of fabricating a wiring board according to claim 1, further including a step of stacking plural insulating layers and wiring portions to form a multi-layered wiring structure.

17. The method of fabricating a wiring board according to claim 1, further comprising:

a step prior to the sixth step of forming a second electrode in the second opening portion; and a seventh step of mounting a semiconductor chip on the second electrode.

18. The method of fabricating a wiring board according to claim 1, further comprising:

a seventh step of connecting a semiconductor chip via a semiconductor chip connecting terminal.

19. The method of fabricating a wiring board according to claim 1, wherein the first electrode is formed on the support board surface by electrolytic plating through an electricity conducting path of the support board in the third step.

20. The method of fabricating a wiring board according to claim 14, wherein the electrode is formed on the support board surface by electrolytic plating through an electricity conducting path of the support board in the second step.

21. The method of fabricating a wiring board according to claim 1, wherein the exposed surface of the first electrode is flush with the surface of the first solder resist layer from which the support board is removed.

22. The method of fabricating a wiring board according to claim 14, wherein the exposed surface of the electrode is flush with the second surface of the insulating layer.

23. The method of fabricating a wiring board according to claim 14, wherein the fourth step includes forming the first solder resist layer on the wiring portion and a first surface of the insulating layer, and the first opening portion of the first solder resist layer exposes a part of the wiring portion.

* * * * *